(12) United States Patent
Yen et al.

(10) Patent No.: US 8,620,660 B2
(45) Date of Patent: Dec. 31, 2013

(54) VERY LOW BIT RATE SIGNAL CODER AND DECODER

(75) Inventors: Anton Yen, San Diego, CA (US); Irina Gorodnitsky, San Diego, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 272 days.

(21) Appl. No.: 12/915,989

(22) Filed: Oct. 29, 2010

(65) Prior Publication Data

US 2012/0109653 A1    May 3, 2012

(51) Int. Cl.
*G10L 13/00*    (2006.01)

(52) U.S. Cl.
USPC ........... 704/258; 704/206; 704/207; 704/219; 704/220

(58) Field of Classification Search
USPC .................. 704/206, 207, 219, 220, 258
See application file for complete search history.

(56) References Cited

U.S. PATENT DOCUMENTS

| | | | |
|---|---|---|---|
| 5,473,727 A | 12/1995 | Nishiguchi et al. | |
| 5,701,390 A | 12/1997 | Griffin et al. | |
| 6,269,332 B1 | 7/2001 | Choo et al. | |
| 2005/0055204 A1* | 3/2005 | Florencio et al. | 704/233 |
| 2009/0129601 A1* | 5/2009 | Ojala et al. | 381/1 |
| 2009/0213959 A1* | 8/2009 | Kondo et al. | 375/295 |

OTHER PUBLICATIONS

Lee et al., Multistage Self-Excited Linear Predictive Speech Coder, Electronics Letters, 1249-1251, vol. 25, No. 18, 1999.
Salami et al., "A Fully Vector Quantized Self-Excited Vocoder", Proceeding ICASP, 124-127, Southampton, UK, 1989.
Heikkinen, "Development of a 4 Kbit/s Hybrid Sinusoidal/CELP Speech Coder", 344-371, Nokia Research Center, Tampere, Finland, 2003.
Rose et al., "The Self-Excited Vocoder—An Alternate Approach to Toll Quality at 4800 bps", 453-456, ICASSP 86 Tokyo, CH2243-4/86, 1986.
Rose et al., "Quality Comparison of Low Complexity 4800 bps Self Excited and Code Excited Vocoders", 1637-1640, 1987 IEEE, CH2396-0/87, 1987.

* cited by examiner

*Primary Examiner* — Jakieda Jackson
(74) *Attorney, Agent, or Firm* — Arthur K. Samora; Kyle Eppele (57) ABSTRACT

Improved oscillator-based source modeling methods for estimating model parameters, for evaluating model quality for restoring the input from the model parameters, and for improving performance over known in the art methods are disclosed. An application of these innovations to speech coding is described. The improved oscillator model is derived from the information contained in the current input signal as well as from some form of data history, often the restored versions of the earlier processed data. Operations can be performed in real time, and compression can be achieved at a user-specified level of performance and, in some cases, without information loss. The new model can be combined with methods in the existing art in order to complement the properties of these methods, to improve overall performance. The present invention is effective for very low bit-rate coding/compression and decoding/decompression of digital signals, including digitized speech and audio signals.

2 Claims, 5 Drawing Sheets

VERY LOW BIT RATE SIGNAL CODER AND DECODER

FEDERALLY-SPONSORED RESEARCH AND DEVELOPMENT

This invention (Navy Case No. 099987) is assigned to the United States Government and is available for licensing for commercial purposes. Licensing and technical inquires may be directed to the Office of Research and Technical Applications, Space and Naval Warfare Systems Center, San Diego, Code 72120, San Diego, Calif. 92152; voice (619) 553-2778; email T2@spawar.navy.mil.

FIELD OF THE INVENTION

The present invention relates to the field of signal and data compression/decompression (lossless and lossy) and coding/decoding, and more particularly, to a new oscillator model, and based on it, systems for obtaining new comprehensive source models for the listed purposes. The invention improves on the current state of the art by providing a comprehensive compact source model for a greater set of signal and data classes, using fewer bits to represent the same information, hence improving efficiency of storing, distributing, and transmitting the information. Some embodiments of the invention pertain to specific applications such as the coding and decoding of speech.

BACKGROUND OF THE INVENTION

The primary objective in signal coding, which also may be referred to as compression, is to minimize the amount of bits being stored or communicated, thus increasing efficiency of storing, distributing, and transmitting the information. Compression is a very general term which is often associated with coding discrete memoryless sources—where any existing pattern in the source evolution is treated statistically rather than in a model form. The present invention pertains primarily to the type of coding where a data sequence evolves according to some quantifiable rule, and more specifically, pertains to obtaining a model—a closed form representation of this rule. The process of transforming a source sequence into a set of model parameters is called encoding and restoring is referred to as decoding.

Typically in encoding, an input signal, which we refer to as a source signal, is divided into intervals, often called frames, sections, or events. Each frame can be transformed by windowing and/or filtering, and possibly other operations, to obtain a windowed/filtered/transformed frame. Standard oscillator models transform a current data frame into a small set of parameters consisting of delays or pointers and weight coefficients associated with them. The pointers reference fixed-lengths blocks in a buffer containing a restored version of the earlier acquired data frames. The restoration of a frame takes place once its model parameters have been estimated, and the restored frame is kept in memory, creating a sequence of historical data that represents a restored version of the input sequence. The blocks of these historic data are chosen so that their weighted sum provides the 'best match' to the current data frame, where 'best match' is defined as the one which minimizes the mean squared error between the current frame and its model. In this way, an input signal is replaced by a set of integer address codes pointing to the match locations and the multiplier coefficients associated with weights of the match data blocks.

One limitation of the standard oscillators is the clear delineation they make between the previously modeled frames of data and the current frame being modeled, in that the data in the current frame cannot participate in deriving the model parameters for that frame. This approach works well for modeling source patterns that re-occur on the time scale that exceeds at least one frame length. Thus oscillators are considered to be methods for modeling long scale structures in data.

Most signal classes, however, contain both short and long scale patterns. In order to comprehensively model these signals, some popular approaches employ two or more separate models to encode the different scale source patterns. For instance, in speech coding, modern toll-quality codecs typically utilize three models in tandem, first a short-term linear predictor, followed by an "adaptive codebook" coder, which models the long scale structure, and finally a third model to encode the residual remaining after the first two models have been applied. Each of the three models has a separate fixed coding budget so the entire code for each speech frame contains three separate sets of coding parameters.

The same underlying approach, where multiple sets of parameters are used to encode a frame, can be said to permeate most other existing coding schemes as well. For example, transform-based methods constitute the most widely used approach for modeling and encoding source sequences. These methods split a signal frame into multiple components, such as frequency bands, wavelets, or other types of waveforms, and these components are coded separately, generating multiple sets of parameters for each frame. For instance, in speech coding, the Multiband Excitation family coders (MBE, IMBE, and AMBE) divide an input signal into frequency bands and encode the individual bands separately, based on voiced/unvoiced characteristics of each band.

Encoding signals with multiple sets of parameters is not efficient if a comparable modeling quality can be achieved with a smaller, single set of parameters. The need to maximize transmission rates and to minimize memory in storage systems motivates development of the more efficient coding technologies described in the invention.

SUMMARY OF THE INVENTION

The overall object of the present invention is to encode as much of the signal information as possible using one parsimonious model, so as to replace as much as possible the multiple sets of parameters used for encoding in the current art. The key part of the innovation is an improved modeling method based on an innovative model, termed the Complete Oscillator Model (COM), which accounts simultaneously for the short- and long-scale patterns in the source, enabling users in many cases to apply a single highly efficient model in place of multiple models used in the existing art. It should be emphasized that the resulting COM does not amount to a combination of separate short and long-scale models. Rather, the resulting COM representations are completely independent of any existing such models. Furthermore, using the COM to comprehensively capture the entire signal structure at once leads to very parsimonious models with far fewer parameters than the total required for separate short and long-scale models in existing art. Due to this efficiency, a wide range of various signal classes can be modeled with high accuracy according to the invention with as few as two oscillator delay terms. The invention can provide lossless coding for completely deterministic sources that evolve according to a continuously defined dynamic rule. In practice, noise and nonstationary features in the input signal most often lead to lossy coding, however.

All oscillators, by definition, use redundancies in the temporal structure of the acquired data to develop a model. Thus, oscillators are generally considered poorly suited for modeling transient features that are not well defined in the acquired data patterns. Common examples include irregular isolated events, such as discontinuities, and also noise-like features. Speech is one example of fast changing signal patterns that can switch abruptly between being semi-oscillatory and noise-like patterns. The COM can be robust to some such conditions considered unfavorable for classical oscillators, for example in the presence of colored noise and certain transients in the source pattern, with the degree of robustness being determined by the complexity of the specific chosen functional form of the COM. However, the COM performance can diminish when such unfavorable conditions are pronounced. The potential loss of performance is not desirable in applications in which a certain level of performance must be met. The second key part of the invention uses COM in such situations to improve coding efficiency of the known in the art methods (KAM's) by combining the COM with the KAM. In this part of the invention, the COM is used in combination with KAM's to reach the desired level of performance. The second utility of such multimodal COM/KAM systems according to the invention is to provide initialization for the COM.

The innovations to apply the above principles encompass the following: an improved oscillator model that uses a unique reference range that includes the previously modeled frames and data from the current frame being modeled; methods for estimating parameters of the resulting models that allow a range of metrics for evaluating qualities of the candidate models to select the optimal model; methods for decoding signals from the model parameters; methods and systems for combining the invention with known in the art methods to initialize COM and to enhance efficiency of existing coding/compression methods; and a speech coder/decoder realized from these innovations, as detailed next.

In one aspect, generally, a new modeling method is provided that uses the maximum possible range of useful data to model and encode an input frame. The maximum range is achieved by augmenting the complete set of the earlier modeled frames with the data points from the current frame, using all the current input data except for the very last point. This allows the short- and long-scale patterns in the source to be encoded by one comprehensive model, resulting in a single parsimonious code.

In another aspect, generally, methods are provided for estimating the parameters of such complete oscillator models in the extended range that includes data points from the current frame, and for restoring (decoding) source sequence from such parameters which must address data points not available at the decoder. Methods are provided for restoring the missing data by reconstructing them point-by-point at the decoder.

In another general aspect, innovative methods for evaluating the quality of the COM model are provided, which extend the evaluation of model error used in the current art to a wide range of options, including metrics based on the quality of the signal reproduced from the model parameters. One novel aspect utilized here comes from the fact the COM produces a signal model and an output decoded from the model parameters that may not be equal to each other. This novel aspect is used to design methods for evaluating COM models based on the quality of the actual model outputs.

In another general aspect, methods are provided for using known in the art methods (KAM's) to initialize COM operations.

In another general aspect, methods and systems are provided for selecting between the COM and KAM's and/or for combining the COM with one or more KAM models for the purpose of encoding an individual frame. A wide range of model selection schemes is provided with multiple options for evaluating and choosing a method for encoding In another general aspect, a method and system for speech coding/decoding is provided which makes a decision to use either the COM or a KAM, or a combination of the COM and the KAM, to achieve the desired quality restored signal for each speech frame.

BRIEF DESCRIPTION OF THE DRAWINGS

The novel features of the present invention will be best understood from the accompanying drawings, taken in conjunction with the accompanying description, in which similarly-referenced characters refer to similarly referenced parts, and in which.

DETAILED DESCRIPTION OF THE EMBODIMENTS

A. Mode 1

The COM Analysis System

Figure 1:
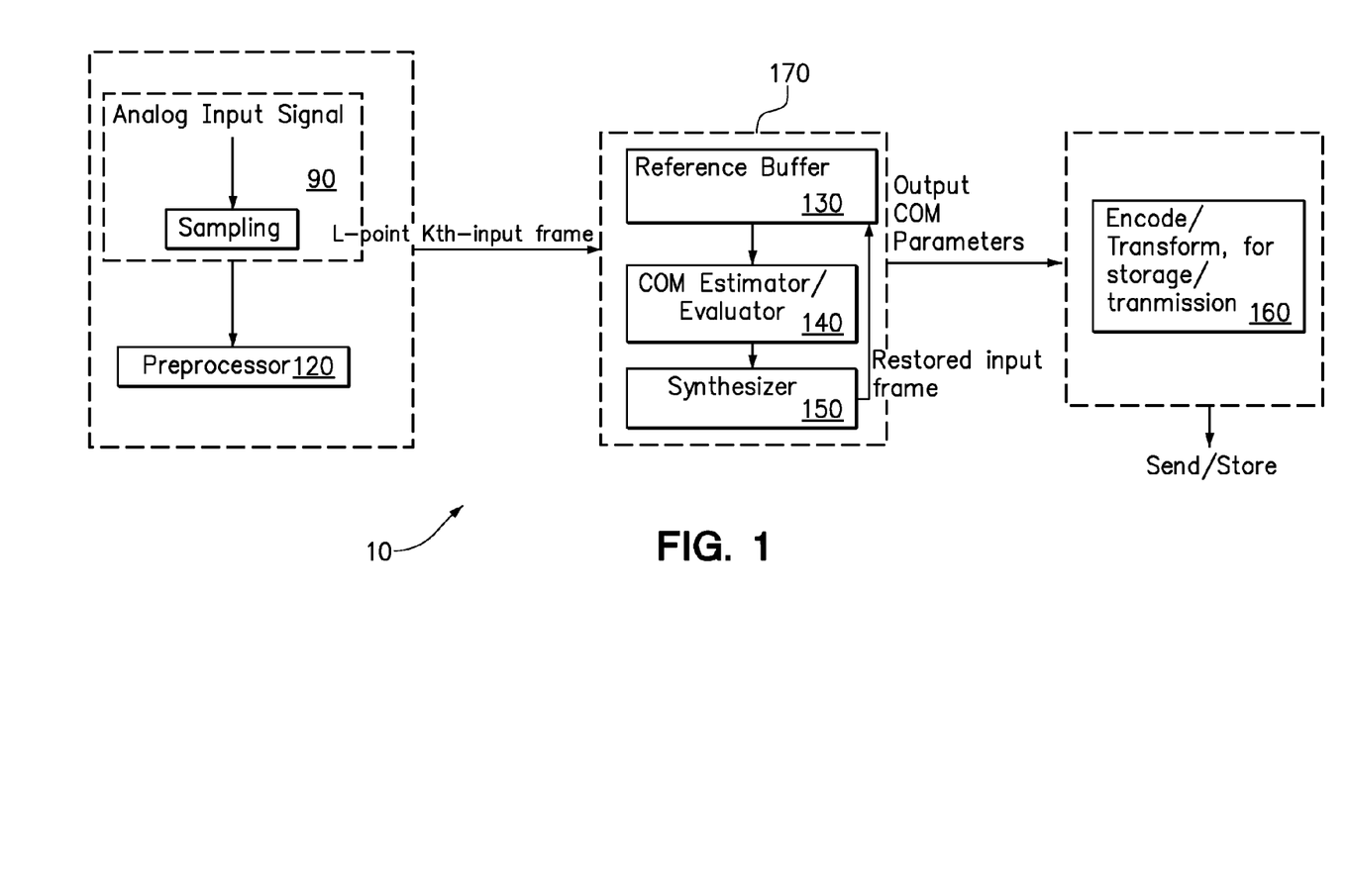
FIG. 1 is a block diagram depicting three basic components of the COM-based analysis/coding system according to several embodiments.

Referring initially to FIG. 1, FIG. 1 shows a diagram of the basic blocks of a Complete Oscillator Model (COM) encoding system 10. COM 10 can contain a preprocessor 120, which builds an L-sample input frame and which can transform an input, for example by windowing and filtering. The preprocessing operations can also include an optional analog sampling, performed in unit 90, which can convert an analog input into a digital signal. COM 10 can further includes COM generator module 170, which is the main COM code generating module; and a postprocessor 160 which organizes/stores/sends the derived code parameters, and which can also analyze/transform these parameters. Digital or analog input can be supplied to the preprocessing module in FIG. 1. Analog inputs can be first sampled in unit 90 prior to being passed to preprocessor 120, while digital signal inputs can be directly received by preprocessor 120.

Preprocessor 120 can output a frame $X_k$ containing L samples of the input signal according to the Equation $X_k=[x(n-L+1), \ldots, x(n)]$, where x (n−L+1) refers to the first data point in the frame, x (n) refers to the last data point in the frame, and the subscript k refers to the sequence index order of a frame with respect to other frames in the input. Preprocessor 120 can also filter, window, or otherwise transform an input frame, using known methods that would be appropriate for the application. Further, overlapping frames $X_k$ may be created, where some part of the data from the preceding frame $X_{k-1}$ is retained in preprocessor 120 and used to make a part of the current frame $X_k$.

Figure 2:
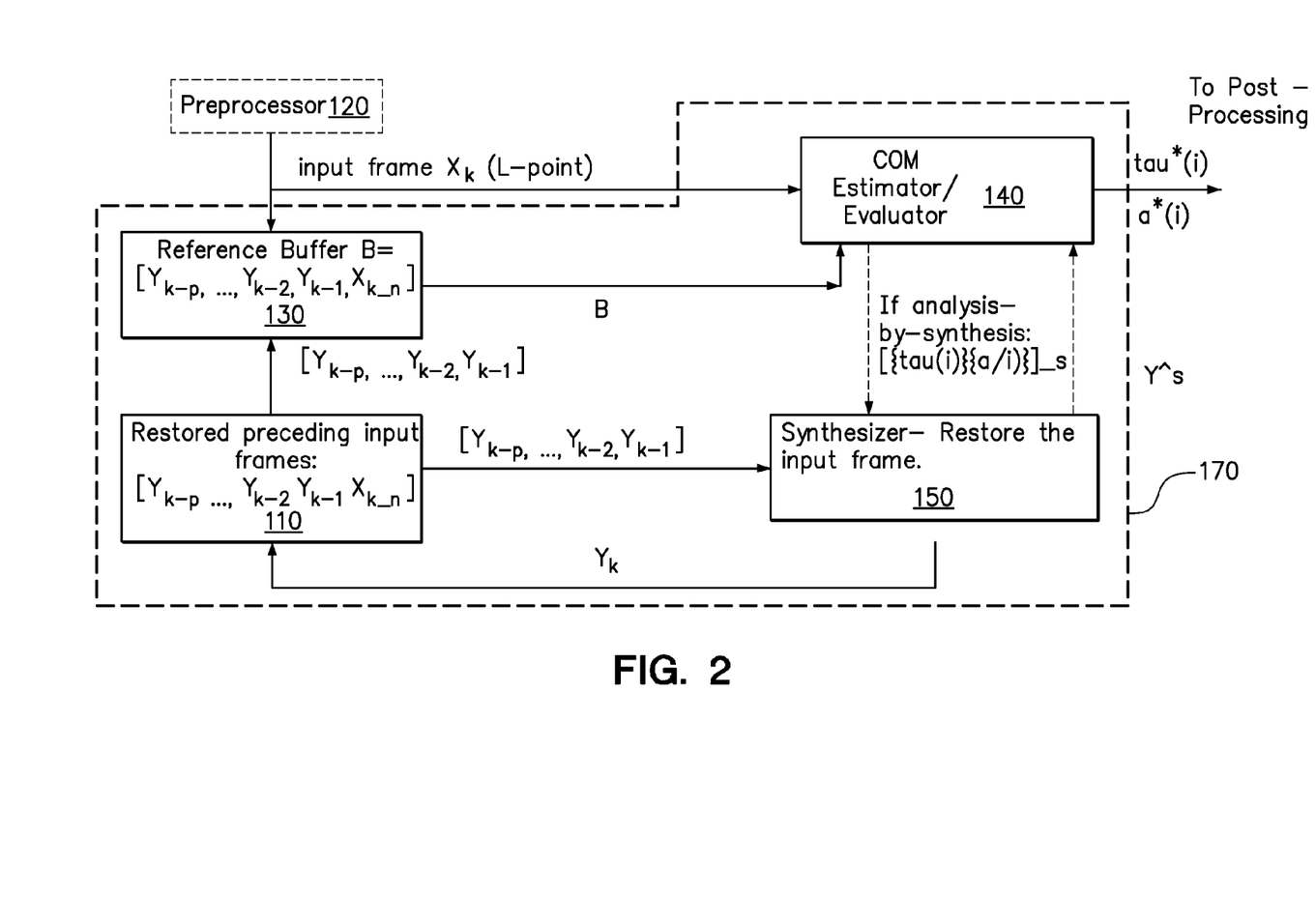
FIG. 2 is a block diagram of the essential analysis component for estimating parameters of the complete oscillator model (COM), which shows the COM estimator/evaluator in greater detail.

FIG. 2 shows a diagram of the basic blocks of the code generating module 170 in greater detail. As shown in FIG. 2, module 170 can contain a storage unit 110, which stores history of the received signal, and also a reference buffer 130, which can selectively receive inputs from storage unit 110 and preprocessor 120. COM generator module 170 can also include a COM model estimator/evaluator 140; and, a signal synthesizer (decoder) 150.

Storage unit 110 in FIG. 2 stores data derived from the historical values of the input received prior to the current frame $X_k$. Such historical values can provide part of the reference data for the COM. In several lossy coder/decoder embodiments, the storage unit 110 accumulates restored earlier input frames $[Y_{k-m}, \ldots, Y_{k-1}]$, which have been synthesized from the derived COM parameters by the decoder 150 (using methods described more fully below). Alternatively, in lossless coder/decoder embodiments, storage unit 110 stores some form of the actual earlier input, optionally transformed as described above in preprocessor 120. Typically, storage unit 110 has a fixed length storage capacity that is sufficient to store enough data to capture at least one complete cycle of the source signal pattern. One cycle of the source pattern is required to model the entire source pattern with COM, but including more cycles provides robustness when operating in non-ideal environments. Thus, the length of the storage buffer in storage unit 110 can depend on the specific application, but it can also be constrained by other considerations, such as the hardware limits. When storage unit 110 is filled to capacity, each time new data points are placed in storage unit 110, the equivalent number of oldest data points is deleted. If overlapping frames are used, the appropriately weighted restored overlapping frames can be combined in 110 to reproduce the restored input sequence within the overlap.

In some embodiments storage unit 110 is empty when the coder starts its operation and can also be cleared in some embodiments anytime the source pattern changes significantly. To acquire data history in storage unit 110 when it is empty, a method known in the existing art can be used to analyze and restore the sufficient number of frames to fill storage unit 110. Systems implementing such means of initialization used in known in the art methods (KAM's) will be described more fully below.

1. Reference Data Buffer 130

In some embodiments of the COM 10, reference buffer 130 in FIG. 2 can combine data history from storage unit 110 (such as that used in typical oscillators known in the art) with n−1 points [x (n−L+1), x (n−1)] from the current input frame $X_k$ inputted from preprocessor 120, using all except the very last point of that frame $X_k$, to create a comprehensive historical data reference for the COM. The points from storage unit 110 and the n−1 points from preprocessor 120 can be arranged sequentially in buffer 130, as shown in FIG. 2. The inclusion of the current points [x(n−L+1), x(n−1)] from $X_k$ in buffer 130 makes the source patterns from the current frame be available as part of the model reference data, which enables the COM to include these patterns in the comprehensive signal model. This is a one aspect that differentiates the COM from existing oscillator models.

It should be appreciated that storage unit 110, preprocessor 120, and buffer 130 do not need to be implemented as physically separate components, but can be implemented in a single software or hardware component, or split arbitrarily across multiple components, as long as the appropriate entries $X_k, Y_k$ are accessed though appropriate software or hardware to emulate the operations described above.

It should be appreciated that the data sequences in units 110, 120, and 130 can refer to all types of transformed, filtered, windowed, or approximated versions of input data. Moreover, the sequences in storage unit 110, preprocessor 120, and buffer 130 can refer to some component, such as a wavelet component, of some raw/transformed/approximate version of the input signal.

2. COM Estimator/Evaluator 140

COM estimator/evaluator 140 accomplishes a model estimating function. The process of model estimation identifies a set of N lengths–L blocks $\{B_{d(i)}\}, i=1,\ldots,N\}$ in the reference buffer 130 such that the input frame $X_k$ is modeled as some specified function of $\{B_{d(i)}\}$:

$$X_k = G(B_{d(i)}), i=1, N, \quad (1)$$

Where:

G denotes a specific function form, linear or nonlinear;
N is the number of $B_{d(i)}$ blocks used in Eq. (1);
i is the index specifying the $i^{th}$ data block $B_{d(i)}$;
$B_{d(i)}$ is the $i^{th}$ block of reference data, referred to as the $i^{th}$ 'tap', that is drawn from reference buffer 130 beginning with the entry d(i) in buffer 130; and,
$d(i) \geq L$ denotes the $i^{th}$ delay (may also be written as $d_i$ for convenience) and is the pointer to the entry in buffer 130 that is the first element in the block $B_{d(i)}$. The upper bound on the delay values is $\max_d = m+L-1$, where m is the number of points in storage unit 110.

The COM defined by Eq. (1) accounts simultaneously for the short- and long-scale patterns in the input signal, which results in a single highly efficient model that replaces the separate models used to encode multiple scales in existing art. The set of delays $\{d_i\}$ provides a means of identifying the appropriate data blocks $\{B_{d(i)}\}$ in buffer 130. Hence, model estimation amounts to estimating the values of delays $\{d_i\}$ and any variables used to define the function G. The function form represented by G is typically tailored to the specific application at hand, and can be nonlinear. Nonlinear COM's can be used to model highly complex source dynamics. In typical applications, however, simple linear COM's containing a few taps are sufficient to model with high accuracy many types of signals, including input signals with certain nonlinear features in the input. For this reason, for increased clarity in the description of several embodiments, the subsequent description of the current mode will place emphasis on the linear COM, with nonlinear COM being envisioned in several embodiments of the present invention.

A linear COM can express $X_k$ as a linear combination of blocks $\{B_{d(i)}\}$:

$$X_k = \sum_{i=1}^{N} a_i B_{d(i)}, \quad (2)$$

where:

N, $d_i$, $B_{d(i)}$ are as defined above in Eq. (1); and,
$a_i$ is the relative scaling (weight) of the corresponding block $B_{d(i)}$.

The parameters needed to be estimated in Eq. (2) are the sets $\{a_i\}$ and $\{d_i\}$ and the number of terms N. However, because of the efficiency of COM 10, many signal classes can be accurately encoded with a 2-tap linear COM, that is N=2. Even in the case of highly complex signal patterns, N=4 is often sufficient. Hence, the choice of N is typically limited and is likely to be known for a given application. In such case, estimating model in Eq. (2) reduces to finding only the parameter sets $\{a_i\}$ and $\{d_i\}$.

a. Estimation of COM Parameters.

The COM parameters described above can be estimated in COM estimator/evaluator 140 by adapting one of several known methods for fitting parametric models to data. Several options are described next with emphasis placed on the linear COM of Eq. (2). The presented methods, however, can be adapted in straightforward way to estimate parameters of nonlinear COM's of Eq. (1), as will be described at the end of this section. All the implementations described here generate a multitude of intermediate model estimates, called candidate models. The 'best performing model', defined as the model that provides the best outcome as measured by pre-set criteria, is chosen from the set of the candidate models using two basic steps: the first step picks one or more candidate delays $\{d_{\hat{t}}\}$, where t=1, ..., D, D≤N and the superscript ^ is used to indicate that this is a candidate value being considered, and retrieves the corresponding delay taps $\{B_{\hat{d}(t)}\}$ from buffer 130.

The second step computes the corresponding to $\{B_{\hat{d}(t)}\}$ coefficients $\{a_{\hat{t}}\}$, by solving by known means the algebraic least-squares problem:

$$[a_{\hat{1}}, \ldots, a_{\hat{t}}]' = \text{inv}[B_{\hat{d}(t)}]X'_k, \quad (3)$$

Where:
$\{B_{\hat{d}(t)}\}$ is a matrix whose columns are the blocks $B_{\hat{d}(t)}$ selected from 130;
$\text{inv}[B_{\hat{d}(t)}]$ is a pseudo-inverse of the $[B_{\hat{d}(t)}]$ matrix, computed using known methods, for example the singular value decomposition method;
$[a_{\hat{1}}, \ldots, a_{\hat{t}}]'$ is a column vector composed of the coefficients $\{a_{\hat{t}}\}$; and,
$X'_k$ is a column vector composed of the elements of the input $X_k$.

The above two steps are repeated to create a multitude of candidate parameter sets $[\{a_{\hat{t}}\}, \{d_{\hat{t}}\}]_j$, where the subscript j=1, ..., J is used to index a particular candidate set, each set derived for the specific choice $\{d_{\hat{t}}\}$ selected in the first step. As an additional step, if appropriate for the given application, COM parameters may be quantized, by means described below.

The optimal set $[\{a_t^*\}, \{d_t^*\}]$, which yields the best outcome as defined by some preset metrics, is found by computing COM model estimates for each candidate set $[\{a_{\hat{t}}\}, \{d_{\hat{t}}\}]_j$ and then applying the preset metrics to evaluate the results. The candidate sets may be created all at once and then evaluated. Alternatively, each new candidate set $[\{a_{\hat{t}}\}, \{d_{\hat{t}}\}]_j$ being created may be evaluated immediately and ranked relative to the already identified Q best candidate sets, and the newly created set is retained or discarded based on the evaluation.

A number of methods, each choice leading to a different embodiment, can be defined for the two basic procedures involved in model estimation, where the first procedure generates the candidate parameter sets from which model estimates are computed and the second procedure evaluates the performance of the candidate models to find the optimal one. Several methods for each procedure will be described next. It should be appreciated that these descriptions provide examples, and the descriptions are not exhaustive means for estimating model parameters. Using other methods based on the basic principles should in no way diminish the claims made in this invention.

b. Methodologies for Generating Candidate Parameter Sets

Three methods for generating candidate parameter sets are described below, which can correspondingly use an exhaustive search, a sequential search, and a constrained search to select candidate delay sets. With one exception, the methods can involve intermediate steps where the model outcomes for the group of candidate parameter sets are compared to identify the set that produces the best performing model in that group. In these cases, the comparisons are done using the evaluation methods which will be described in the next subsection. One method is an exhaustive search which can select combinations of N delays from the range of integer values [L, $\max_d$], and then compute the corresponding coefficients $\{a_{\hat{1}}, a_{\hat{2}}, \ldots, a_{\hat{N}}\}$ for each combination by solving Eq. 3 above. The exhaustive search method can generate all possible sets of delay and the corresponding coefficient values first and then evaluate the outcomes from all the resulting candidate models to identify the optimal parameter set that produces the best model outcome. Alternatively, one of many existing intelligent search methods may be used, such as evolutionary programming, which can generate a candidate parameter set and evaluate its model outcome one at a time. The exhaustive search method can produce the closest to the optimal model among the three methods but it can be computationally expensive when estimating COM's that contain more than two delays.

Another method is the sequential search approach, which can use an iterative process that finds a subset of best parameter values for each search iteration. For example, a sequential search which considers one delay at a time is implemented as follows. First, the optimal delay value $d_1^*$ is found for the one-delay COM of Eq. (2), i.e. $X_k = a_1 B_{\hat{d}(1)}$, by evaluating the candidate model outcomes for all possible values of $d_{\hat{1}}$ chosen from the [L $\max_d$] range and their corresponding coefficients $a_{\hat{1}}$ found by solving Eq. 3. In the next iteration, the optimal $d_2^*$ value is found by evaluating all the candidate two-delay COM's in which the $d_1^*$ value is kept fixed to the value found in the first iteration, and the candidate $d_{\hat{2}}$ values are selected from the [L, $\max_d$] range. The coefficients $\{a_{\hat{1}}, a_{\hat{2}}\}$ corresponding to candidate set of delays $\{d_1^*, d_{\hat{2}}\}$, $L \leq d_{\hat{2}} \leq \max_d$ are calculated by solving Eq. 3 as before. Note that while the value of $d_1^*$ is fixed for the subsequent iterations, the values of the coefficient $a_1$ is not and must be recalculated in each subsequent iteration. The process repeats until the optimal values for all the COM parameters are obtained. The sequential search method can produce near-optimal results at a significantly lower complexity than the exhaustive search.

The third method is a constrained search which can combine certain aspects of the preceding two methods. First, a sequential search is performed as described above to produce a "seed" estimate $\{d_{\hat{1}}, d_{\hat{2}}, \ldots, d_{\hat{N}}\}$, $L \leq d_{\hat{i}} \leq \max_d$. This estimate then serves as a baseline for selecting candidate delays by constraining them to the range around the seed: $d_{\hat{i}} - \mu \leq d_{\hat{i}} \leq d_{\hat{i}} + \mu$, i=1, ..., N, where $\mu$ specifies the number of points around each $d_{\hat{i}}$ and its value is set depending on the desired search complexity. The exhaustive search procedure described above is used within this constrained candidate delay range to generate new sets of candidate parameters and evaluate the corresponding model outcomes to identify the parameter values that produce the best model outcome. The performance of this method is typically between that of the first two methods.

Adaptations of various methods that can be used by COM estimator/evaluator 140 for the purpose of evaluating model quality are described next. The current art for evaluating quality of closed form models typically uses some measure involving the candidate model estimates, i.e., $X_{\hat{k}}(j) = \Sigma_i D\, a_{\hat{i}} B_{\hat{d}(t)}$ as given here for the instance of the $j^{th}$ candidate parameter set $[\{a_i\}, \{d_i\}]_j$ with $t=1, \ldots D$, $D \leq N$. A common measure in this regard is the mean squared error (MSE), given for the instance of $j^{th}$ candidate parameter set $[\{\hat{a}\}, \{\hat{d}\}]_j$ as:

$$MSE(j) = \frac{1}{L}[X_k - X_{\hat{k}}(j)]'[X_k - X_{\hat{k}}(j)]. \quad (4)$$

The best candidate model is identified in this case as the model which minimizes the MSE. In general, a large number of metrics exist that can be substituted in place of the MSE to analyze statistical, temporal and frequency domain properties of model estimates or functions of these estimates, such as the residual error that was used in Eq. 4. Typically, the choice of a metric or metrics is determined by the needs of the specific application. The invention covers use of any of the existing in the art metrics, individually or in conjunction with other known metrics, for the purpose of evaluating the quality of the candidate COM models.

One novel aspect of the COM in several embodiments is the use of a second analysis outcome, which is the actual output $Y_{\hat{k}}$ being decoded or synthesized from the supplied candidate parameter set and which is computed in synthesizer 150 by means described below. The key observation is that the synthesized $Y_{\hat{k}}$ values may or may not be equal to the estimated $X_{\hat{k}}$ values for a given parameter set in the case of the COM. Further, the exact values for the synthesized $Y_{\hat{k}}$ can be computed by using quantized rather than exact model parameters, where quantization is done by means described below. Analogously, the user has an option of computing candidate models $X_{\hat{k}}$ from quantized parameters. Thus, in addition to the regular model estimate, three other outcome choices are available for model quality evaluation, namely the model estimates computed from quantized parameters and the decoded signals $Y_{\hat{k}}$ computed either from the raw or the quantized parameters. The large choice of metrics described above can be adapted for use with any of these variables or functions of these variables to evaluate the quality of the model outcome. For example, the existing metrics used to evaluate closed form models (such as the MSE in Eq. (4)) can be modified where all instances of the model estimate $X_{\hat{k}}$ are replaced with the synthesized output $Y_{\hat{k}}$. In practice, it is more meaningful to apply certain metrics to the synthesized $Y_{\hat{k}}$ and other metrics to $X_{\hat{k}}$, and the choice would be determined by the application at hand. For example, in applications involving signals such as speech, it is desirable to optimize the perceptual characteristics of the decoded output $Y_{\hat{k}}$ rather than some property of $X_{\hat{k}}$. It should be noted that model evaluation involving $Y_{\hat{k}}$ can be viewed as related to analysis-by-synthesis, a technique in which system outputs are derived for a multitude of excitation inputs and are evaluated to determine the best outcome. In the case of the COM, a multitude of system outputs $Y_{\hat{k}}$ can be similarly analyzed. Examples of some metrics is given below, written for the instance of evaluating $Y_{\hat{k}}$, but, as stated above, these and other metrics in existing art can alternatively be utilized with $X_{\hat{k}}$ to evaluate COM quality, if justified by a given application.

SIGNAL-TO-NOISE RATIO: Minimum signal-to-noise ratio (SNR) can be is a common criterion used for selecting the optimal model. SNR is computed as $$SNR(j) = 10\log_{10}\frac{X_k^2}{[X_k - Y_{\hat{k}}(j)]^2}, \quad (5)$$

where j indicates the index of the candidate parameter set $[\{a_i\}, \{d_i\}]_j$.

LOG-SPECTRAL DISTANCE: Log-spectral distance (LSD) can be another common metric for evaluating spectral properties of the model outcome. It is given by $$LSD(j) = \sqrt{\frac{1}{f_s}\int_0^{f_s} 10\log_{10}\frac{|F[X_k](f)|^2}{|F[Y_{\hat{k}}](j,f)|^2}df}, \quad (6)$$

where
$f_s$ is the sampling frequency;
F indicates a Fourier Transform;
f is the frequency bin of interesting ranging from [0, fs]; and,
j is the index of the candidate parameter set $[\{a_i\}, \{d_i\}]_j$.

A common metric for evaluating perceptual quality of a signal is the perceptually-weighted error (PWE). The best perceptual quality is achieved by the $Y_{\hat{k}}$ frame that minimizes PWE:

$$PWE(j) = \frac{1}{f_s}\int_0^{f_s}|F[X_k](f) - F[Y_{\hat{k}}](j,f)|^2|W(f)|^2df, \quad (7)$$

where
$f_{s,j}$ and F[.] are defined above in Eq. (6);
| | indicates the magnitude spectrum;
W (z): is a weighting filter given by $$W(z) = \frac{Z[b](z/\gamma_1)}{Z[b](z/\gamma_2)}$$

where
Z indicates the Z-transform and coefficients b are computed by minimizing a misfit error of a linear prediction model:

$$X_k = \sum_{u=1}^{U} b_u X_k(u), \quad (8)$$

where $X_k$ (u)=[x (n−u−L+1), . . . , x(n−u−1)] denotes the length−L data sequence that has latency u−1 with respect to the last point of the current frame.

The methods described here should not be interpreted as providing comprehensive or exhaustive means for performing said model evaluations. Using other evaluation methods based on the basic principles should in no way diminish the claims made in this invention. Further, multiple metrics, including but not limited to the metrics described above, utilizing either $X_{\hat{k}}$ or $Y_{\hat{k}}$, can be applied to evaluate model quality. For example, an embodiment that uses two metrics sequentially may first generate q best candidate models according to the minimum MSE in Eq. (4), then synthesize in synthesizer (decoder) 150 the q outputs $Y_{\hat{k}}$ from the quantized parameters of these q best candidate models and pass the synthesized outputs to COM estimator/evaluator in 140 where they are then be evaluated according to the PWE perceptual metric in Eq. (7).

The processing step accomplished by COM estimator/evaluator 140 can include quantization of the parameters. This step can be implemented using any number of methods from the existing art, including but not limited to vector quantization for the coefficients {$a_i$}, scalar quantization for the delays {$d_i$}, and all derivatives thereof.

The outcome of the evaluations performed in COM estimator/evaluator 140 can be the optimal parameter set [{$a_i$}, {$d_i$}]* that produce the best model outcome. This set constitutes the COM code for the frame $X_K$ that is being modeled. The set can contain either the raw or the quantized parameters, (whichever ones were employed in the evaluation), and it is outputted from COM estimator/evaluator 140 to synthesizer 150 and also to the post-processor 160 for storage or transmission. Unit 150 synthesizes the corresponding optimal restored frame $Y_k$*, if it has not been stored, and outputs it to storage unit 110. Unit 160 may further process or transform the code prior to storing/transmitting it by means appropriate for the application at hand. For example, if the parameters have not been quantized in COM estimator/evaluator 140, they may be quantized in post-processor 160 using methods in existing art stated above.

The analysis steps described above can be transferred in a straightforward way to any nonlinear model that consist of a weighted sum of linear and nonlinear functions of $B_{d(i)}$. Further, a general nonlinear function can be as approximated by a truncated polynomial expansion which consists of such a weighted sum of linear and nonlinear functions of $B_{d(i)}$. The analysis methods described above can be adapted to estimate such nonlinear models, as follows. The delays continue to index data blocks in the reference buffer 130 as before. The blocks of data $B_{d(i)}$ are retrieved for each delay value as above and are used to compute a sets of new blocks {$B_{term\ (c)}$}, where each $B_{term\ (c)}$ is the function of $B_{d(i)}$ and constitutes the cth term of the series expansion and where index c=1, ..., C stands for the cth term of the model. After the blocks $B_{term\ (c)}$ are computed, their weights are computed analogous to the coefficients {$a_i$} in the linear COM, by substituting in Eq. 3 the terms {$B_{term\ (c)}$} for the {$B_{d(i)}$}. The rest of the analysis can proceed as described for the linear COM above.

3. Decoding of a Signal in Synthesizer 150 and Decoder 250

Figure 3:
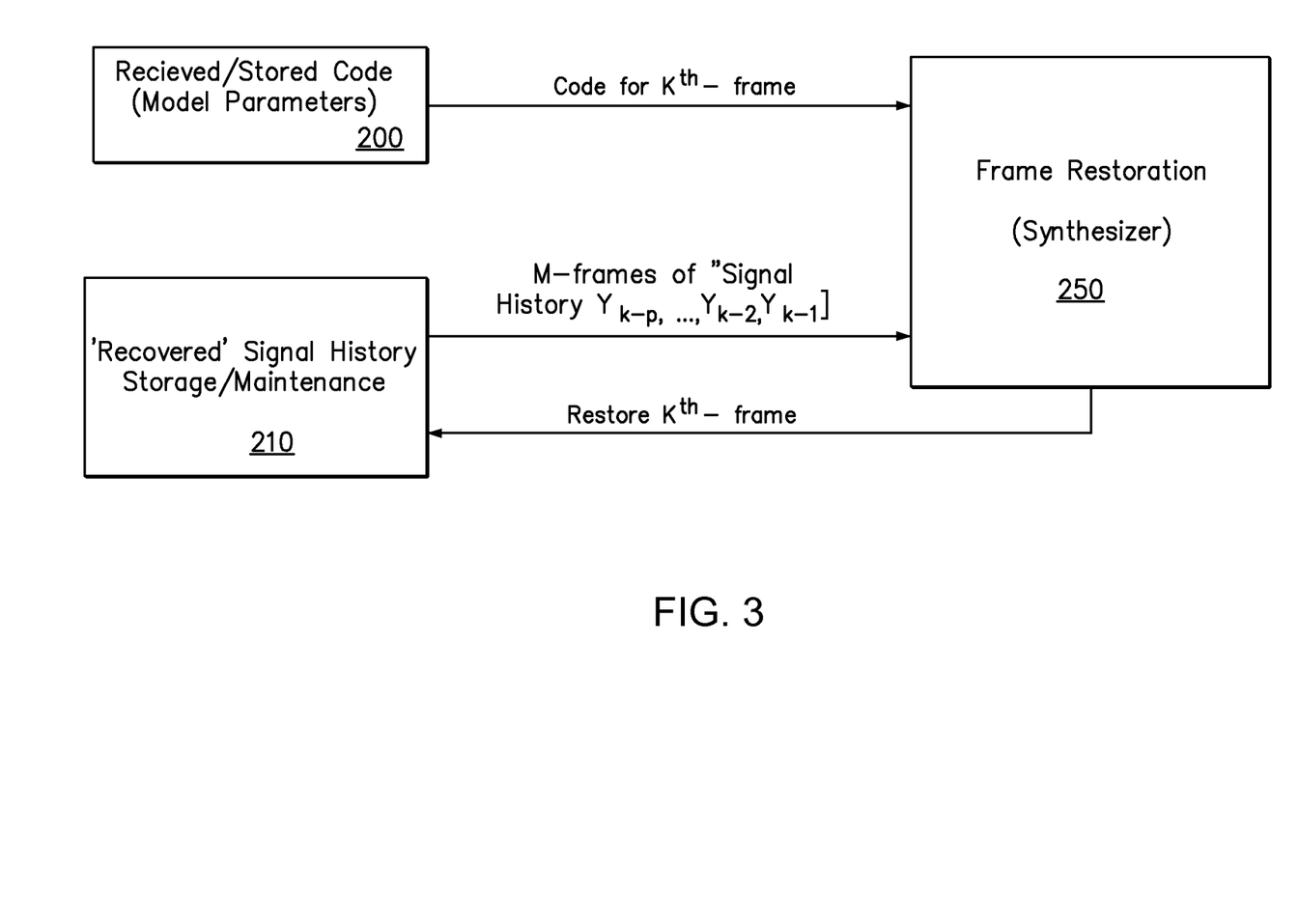
FIG. 3 is a block diagram of the COM which illustrated the synthesizer/decoder that restores the signal from the received COM parameters.

Decoding refers to the operation performed in synthesizer 150 in FIG. 2 and also in unit 250 in FIG. 3, which represents a standalone decoding system that can acquire transmitted/stored code. The synthesizer (decoder) 150/250 restores to some precision the original input frame from the supplied parameters. In the case of synthesizer 150 of FIG. 2, the parameters are inputted from COM estimator/evaluator 140, and in the case of the standalone decoding system in FIG. 3, the parameters are obtained from the transmitted/stored code. In the decoder embodiment described in FIG. 3, the signal is restored in unit 250 in the same way it is synthesized in 150. Unit 210 in FIG. 3 contains the restored 'signal history' [$Y_{k-m}, \ldots, Y_{k-1}$] and it mirrors the function of storage unit 110 in FIG. 2. In the event none of the delays {$d_i$} in the code supplied to units 150/250 index the last L−1 data points in the storage unit 110/210, the current frame $Y_k$ is restored from the supplied parameter set analogous to the computation of the model estimate given by the Eq. (2) above for frames $X_k$, that is:

$$Y_k = \sum_{i=1}^{N} a_i B_{d(i)}.$$

Otherwise, if one or more delays index one or more of the last L−1 data points in the storage unit 110/210, synthesizers 150/250 synthesize the entries of $Y_k$ point-by-point, beginning with the earliest point of the current frame and advancing toward the end of the frame, estimating each point as:

$$y(s) = \sum_{i=1}^{N} a_i y(d(i) + s - 1)$$

where y(d(i)+s−1) refers either to the restored element in unit 110/210, if (d(i)+s−1)>L, or, otherwise, to the element of the current frame that has been synthesized prior to the current y(s) and is being held in the respective buffers accessed by the synthesizers 150/250.

B. Mode 2

Combining COM with Known in the Art Methods (KAM's)

Figure 4:
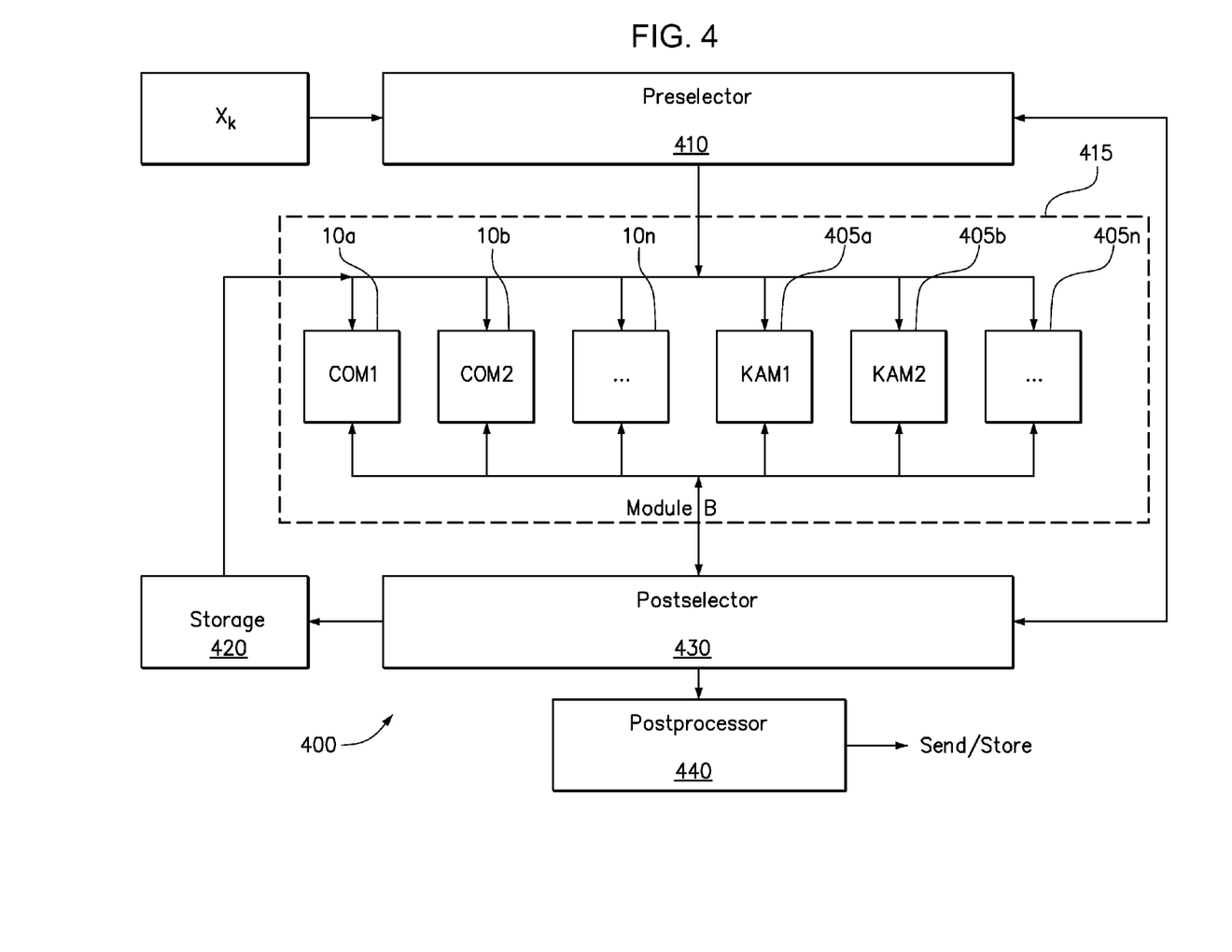
FIG. 4 is a block diagram that illustrates components of a general multimodal COM/KAM system according to several embodiments; and, FIG. 5 is a block diagram depicting a speech analysis (encoding) system utilizing a multimodal COM/PACT implementation.

Referring now to FIG. 4, FIG. 4 shows the general structure of a hybrid, multi-mode COM/KAM system 400, which encodes an input frame by choosing among various forms of the COM 10$_a$, 10$_b$, 10$_n$, and various known in the art methods (KAM's) 405$_a$, 405$_b$, ... 405$_n$, and combinations thereof, the various blocks and units of which may be implemented in hardware, software, or a combination thereof. The embodiments of system 400 provide two practical functions: 1) Initialization of the COM; and, 2) Improving performance of KAM's in applications where the COM by itself does not provide the desired level of performance. As discussed in the Summary of the Invention, 'pattern-breaking' events in the input signal, such as significant rise in unstructured energy, discontinuities, and transients that occur on a short time-scale relative to the scale on which on-going patterns in the signal evolve, can negatively impact COM performance. In such cases, KAM 405 can be used to encode some parts of the signal and COM can be used to encode other parts, to enhance the overall performance over what can be provided by the KAM alone.

The COM/KAM system in FIG. 4 can include a preselector 410, which can analyze the input signal $X_k$ and choose which COM 10, KAM 405, or combination of COM 10/KAM 405 to be used to model $X_k$; a COM/KAM encoding module 415, which can contain a bank of various COM's 10 and KAM's 405 model estimation units, which can be activated by the preselector 410 and/or the postselector 430; a storage unit 420 which contains restored earlier input frames [$Y_{k-m}, \ldots, Y_{k-1}$] that can be accessed by the COM's 10 and/or possibly some of the KAM's 405 unit(s) of COM/KAM Module 415; a postselector 430, which routes the relevant output from the ultimately selected 'best' model to storage 420 and postprocessor 440 and, optionally, it can evaluate the outputs of the candidate models supplied from COM/KAM Module 415; and postprocessor 440.

For Mode 2, the preprocessing in preselector 410 that produces input frames for the multimodal COM/KAM system can be the same as the preprocessing done in the corresponding preprocessor 120 of FIG. 1 described in Mode 1, so the description of this component and associated preprocessing steps is not repeated for Mode 2. Similarly, the postprocessor unit 440 in FIG. 4 can be implemented analogously to post-processor 160 in Mode 1 (See. FIG. 1), with the exception that postprocessor 440 can perform an additional function, which is to package the parameters of the final model together with their model identifier code. The model identifier code is supplied to 440 by postselector 430, along with the model parameters, and consists of the minimum number of bits necessary for a given system to specify which model or combination of models has been used for encoding the current frame.

Preselector 410 and postselector 430, and COM/KAM Module 415 in FIG. 4, provide the main blocks for various embodiments of the COM/KAM system. Embodiments of three basic implementations of the COM/KAM system will be described below following the description of operations performed by units 410 and 430, and COM/KAM Module 415.

For operation, preselector 410 can select a set of COM's 10 and/or KAM's 405 in COM/KAM Module 415. In some embodiments, the implementation of preselector 410 can be a simple de-multiplexer that selects between just two models, a single COM 10 and a single implemented KAM 405, and may, optionally, also select a combination of the two. Alternatively, preselector 410 can perform sophisticated processes of selecting methods in COM/KAM Module 415 based on the nature of the input signal $X_k$. Such selection processes can involve computing parameters for the input $X_k$ that reflect statistical and/or deterministic properties of the signal, analyzing these properties and then using the results to select the combinations of multiple COM's $10_a$-$10_n$ and KAM's $405_a$-$405_n$ to model $X_k$. Depending on what is appropriate for a given application, the computed parameters for the input $X_k$ can reflect any number of statistical, temporal, frequency, and time-frequency properties of the signal, which can be obtained using prior art methods. The computed parameter values can be analyzed relative to preset baselines/thresholds and other predetermined metrics.

Preselector 410 can be particularly useful for detecting 'pattern-breaking' events. For these embodiments, preselector 410 can analyze consistency of certain parameters across the current and the preceding frames $X_k$. For example, preselector 410 can compare the distribution of the deterministic energy in $X_k$ relative to that in some preceding input frames $[X_{k-j} \ldots X_{k-1}]$. The distribution can be measured, for example, by computing fundamental frequency (called pitch period in speech coding) and other parameters which can reveal the proportion of quasi-periodic energy (V) and noise-like energy (U) in the frames. These parameters can be estimated using known in the art methods. For example, some speech coders compute U and V parameters using Fourier Transform (FT) based methods, such as Fast Fourier Transforms (FFT's), to make voiced/unvoiced determination for each frame. The computed parameters V (t, w), for the quasi-periodic energy and U (t, w), for the noise-like energy, are functions of time (t) and frequency (w). Many other methods, for example, based on autocorrelation, can also be used. The computed distribution of the quasi-periodic and noise-like energy in time and frequency in the given frame relative to the distribution of these quantities in the preceding frames could control whether and how many COM's 10 and KAM's 405 can be selected by preselector 410. Such control process can be implemented in a number of known ways as well, taking into account the desired quality of the output. For example, the distribution of the quasi-periodic energy V and noise-like energy U can be partitioned into ranges or bins and a particular choice of a COM and/or KAM can be assigned to each bin.

Preselector 410 can also receive control commands from external resources, which can modify the settings in preselector 410 or, alternatively, the commands can be integrated as part of the decision logic in preselector 410. For example, knowledge of when 'pattern-breaking' events occur may be available outside the COM/KAM system, in which case the external command can supply this information to preselector 410, thus freeing preselector 410 from performing such analyses.

As stated above, COM/KAM Module 415 in FIG. 4 contains a bank of one or more COM 10 and KAM 405 estimators. Each COM 10 in COM/KAM Module 415 estimates a different functional form of the COM. For example, COM/KAM Module 415 can contain a bank of 4 COM units, where each individual unit estimates a linear COM with a specific number of delays, ranging from 1 to 4. Each COM 10 or KAM 405 can be assumed to stay inactive until it is switched "on" by inputting to it a frame of points either from preselector 410, postselector 430, or from another COM 10 or KAM 405 within COM/KAM Module 415. Thus, the COM and KAM units can be switched "on" and applied to the provided input individually or in various combinations, that is in-series, in-parallel, or a mix of in-series and in-parallel combinations. In a 'in-series' combination, the first selected unit encodes $X_k$, the next unit encodes the residual output of the first, and so forth, the end result being a serial model, for example (COM $10_a$+KAM $405_a$+ ... KAM $405_h$). In an 'in-parallel' combination, the first selected unit encodes a part of $X_k$, the next unit encodes another part of $X_k$, and so forth. Further, these described approaches can be used in conjunction with each other to create any type of COM/KAM combination.

KAM 405 units can use known methods to estimate their respective models. Also, in several embodiments, the COM 10 units in FIG. 4, estimate models using the same operations as COM estimator/evaluator 140 and synthesizer 150 of COM 10 described above (See FIG. 2), with the following exception. The evaluation of candidate model quality which was described for COM evaluator/estimator 140 above may be split in Mode 2 between the model estimation units of COM/KAM Module 415 and postselector 430. The way this part of the process may be split can depend on the choice of a particular COM/KAM system implementation, which some choices being described more fully below. Regardless of how the model evaluation function may be divided between COM/KAM Module 415 and postselector 430, however, the overall process and the metrics used for evaluating the candidate models to select the optimal model for the given method are analogous to those described for unit 140. Further, it should be noted that in several embodiments, candidate model outputs are synthesized within the respective COM or KAM estimation unit. An alternative embodiment may use other components within or outside COM/KAM Module 415 to synthesize these model outputs for some of the embodiments.

It should be appreciated that the separate COM's 10 and KAM's 405 in COM/KAM Module 415 shown in FIG. 4 are used to represent the different forms of the COM 10 and the KAM strictly for the sake of clarity of the description. Estimation of several model types can be accomplished within a single unit or split in some way across several units, in which cases software or hardware would be used to select the specific terms appropriate for the desired model. For example, instead of using four separate units to estimate the four linear COM's, each having a different number of delays ranging from 1 to 4, COM/KAM Module 415 may have a single COM unit allowing up to four delays and the desired number of delays would be chosen during the estimation process.

Once model estimation process in COM/KAM Module 415 is completed, the modeling results can be supplied to postselector 430 for further processing. As shown in FIG. 4, postselector 430 can receive results from the COM/KAM Module 415 and can assess the supplied results. The choice of a particular implementation algorithm of the COM/KAM system 400 (some available algorithms are described below) controls how much processing is performed in postselector 430. The following describes the complete set of functions that postselector 430 can perform with the understanding that the specific implementations can incorporate all or a part of the described processing steps.

One function that can be performed in postselector 430 is an evaluation of analysis outcomes received from COM/KAM Module 415. Two types of evaluations can be performed. The first type evaluates model quality and can be used to help select among the various candidate models obtained from a single modeling method. The second type can be used to chosen among the results from different COM's 10 and/or KAM's 405 from COM/KAM Module 415. The first type of evaluation can be implemented in postselector 430 using methods for evaluating model quality which were described for COM estimator/evaluator 140 in Mode 1. The second type can be implemented using the same methods for evaluating model quality as in the COM estimator/evaluator 140 in Mode 1, but it can also include performance measures other than those related to the model quality. Examples include coding efficiency in terms of the number of bits required to encode the given parameter set, computational complexity, model robustness with respect to environmental noise, quantization robustness, and other performance metrics that are known in the art and suitable for the specific applications at hand. All these known measures can be computed using prior art methods. Further, multiple performance metrics can be used in conjunction with each other and with measures related to model quality, in which case the evaluation would typically involve a performance trade-off based on multiple metrics. One example is a selection criterion that involves a trade-off between the model quality and coding efficiency.

The evaluation outcome can control the decision process made in postselector 430. One implementation option is for postselector 430 to always select the best model according to some preset criteria which becomes the final outcome of the analysis, in which case postselector 430 outputs the selected model parameters together with the model identifier code to postprocessor 440, and, if available, outputs to storage 420 the $Y_k^*$ frame restored from the parameters of the selected model. If such $Y_k^*$ is not available, postselector 430 instructs COM/KAM Module 415 to synthesize such $Y_k^*$ and to output it to unit 420. Alternatively, in some implementation options postselector 430 can choose to continue the model estimation process in COM/KAM Module 415. To initiate a new iteration of the model estimation process, postselector 430 inputs frames of data to those estimation units of COM/KAM Module 415 that it selected for the new iteration. The data frames supplied to 415 through postselector 430 may contain the original input $X_k$ or, alternatively, some form of the residual error obtained from a previous iteration. Such iterative steps may be repeated until postselector 430 chooses the final model and terminates the model estimation process by outputting the selected model parameters together with the model identifier code to unit 440, and also outputting to unit 420 the $Y_k^*$ frame restored by the selected model, as described immediately above.

There are three basic embodiments of the COM/KAM system 400, which can combine in different logical sequences the various functions performed in preselector 410, COM/KAM module 415 and postprocessor 430. These embodiments can be referred to as Decision-First (DF), Decision-Later (DL), and Mixed-Decision (MD) embodiments. A specific example of an MD embodiment for a speech coder will be provided in Mode 3.

Decision-First (DF): The DF embodiment makes all the decisions regarding the choice of a model in the preselector 410 in FIG. 4, and selects one specific method, which can be a COM or a KAM, or a combination of some COM's and/or KAM's, for encoding a given frame $X_k$. The most basic example of DF embodiment is a system for COM initialization, in which the basic COM/KAM system consists of one COM and one KAM. In this case, unit 410 is a simple switch set to select the KAM at the start of the system operation (and after events requiring re-initialization), until enough signal history $[Y_{k-m}, \ldots, Y_{k-1}]$ is generated in unit 420 to enable COM operations. After this occurs, preselector 410 can be set to select the COM. More complex DF implementations that can select among multiple choices of COMS's $10a$-$10n$ and KAM's $405a$-$405n$ can be obtained which employ analyses of the input $X_k$ as was described above in the description of preselector 410.

Decision-Later (DL): The DL embodiment makes all the decisions regarding the choice of a model or models in the postselector 430, instead of in preselector 410. The DL strategy allows several possible embodiments. The most basic DL strategy estimates candidate models for all available method options and then postselector 430 selects among all the methods by comparing results from their respective best models, using one or more evaluation metrics for assessing model quality and other performance measures that were given above under the description of postselector 430. This strategy may be used, for example, when the goal is to choose the best overall performing model according to some predetermined set of criteria. More complex DL strategies can consist of several iterative steps that involve evaluating results from multiple models in postselector 430 in each iteration until the desired performance is obtained. This DL strategy may be used, for example, when the evaluation criteria involves trade-offs, for example finding the model COM 10 and/or KAM 405 that provides the most efficient bit rate and that meets or exceeds a preset requirement for model quality. In this example, the most efficient model can be estimated first using methods described above, and if its outcome is found to not meet the desired output quality requirement, the process is repeated for the next most efficient available model, until the model meeting the desired quality is reached.

The iterative DL embodiment can incorporate more complex logic based on known decision making protocols. For example, the outcome from one iterative step may be evaluated and, based on the results, a set of completely different COM's 10 or KAM's 405 from the set that was used in the previous step may be chosen for the next iteration by postselector 430. For example, postselector 430 may switch the methodology used from a COM 10 to a KAM 405 based on the outcome of the evaluation from a given iteration. Further, postselector 430 can direct such new model to be estimated for the original input frame $X_k$; or, alternatively, for the residual error from a model evaluated in one of the previous iterations. When a residual is used as an input to another model, this results in an 'in-series' combination of models described above. The iterative process can terminate once a predetermined number of iterations have been completed. Alternatively, postselector 430 can make the decision to terminate iterations once it finds the model that satisfies the preset criteria.

Mixed-Decision (MD): The MD embodiment can use both the preselector 410 and the postselector 430 to combine attributes of the DF and DL strategies. In an MD embodiment, preselector 410 can select a set of potential methods to be evaluated for each frame, rather than specifying a single method as done in the DF embodiment. Unit 430 can accomplish further selection from among the chosen models after they have been evaluated. Thus, preselector 410 can be used to narrow down the choice of COM's 10 and KAM's 405 in COM/KAM Module 415 that need to be considered for a given frame. At the same time, when appropriate, postselector 430 can change this determination after the chosen models has been evaluated and choose another model not originally selected by preselector 410.

It should be appreciated that the strategies described above represent a few basic system implementation options from which an infinite set of possible embodiments can be developed that combine COM's and KAM's in various ways.

Decoding

In all COM/KAM embodiments the decoder appraises the received model identifier code and reconstructs the output signal $Y_k^*$ accordingly, using the method that corresponds to the one used to encode $X_k$. Such a method used by the coder may be a COM or a KAM, or a combination of COM's and/or KAM's. Each part of the signal that was encoded by a KAM is decoded using the known decoding method for that KAM. Each part of the signal that was encoded by a COM is decoded using the corresponding decoding method described in Mode 1. The restored frames are accumulated in a storage unit of the decoder in a way that mirrors the accumulation of the restored frames in storage 420 on the coder side, and are used in restoring the future frames as needed.

Mode 3

Speech Coding/Decoding Using a Mixed COM/PACT Implementation

Figure 5:
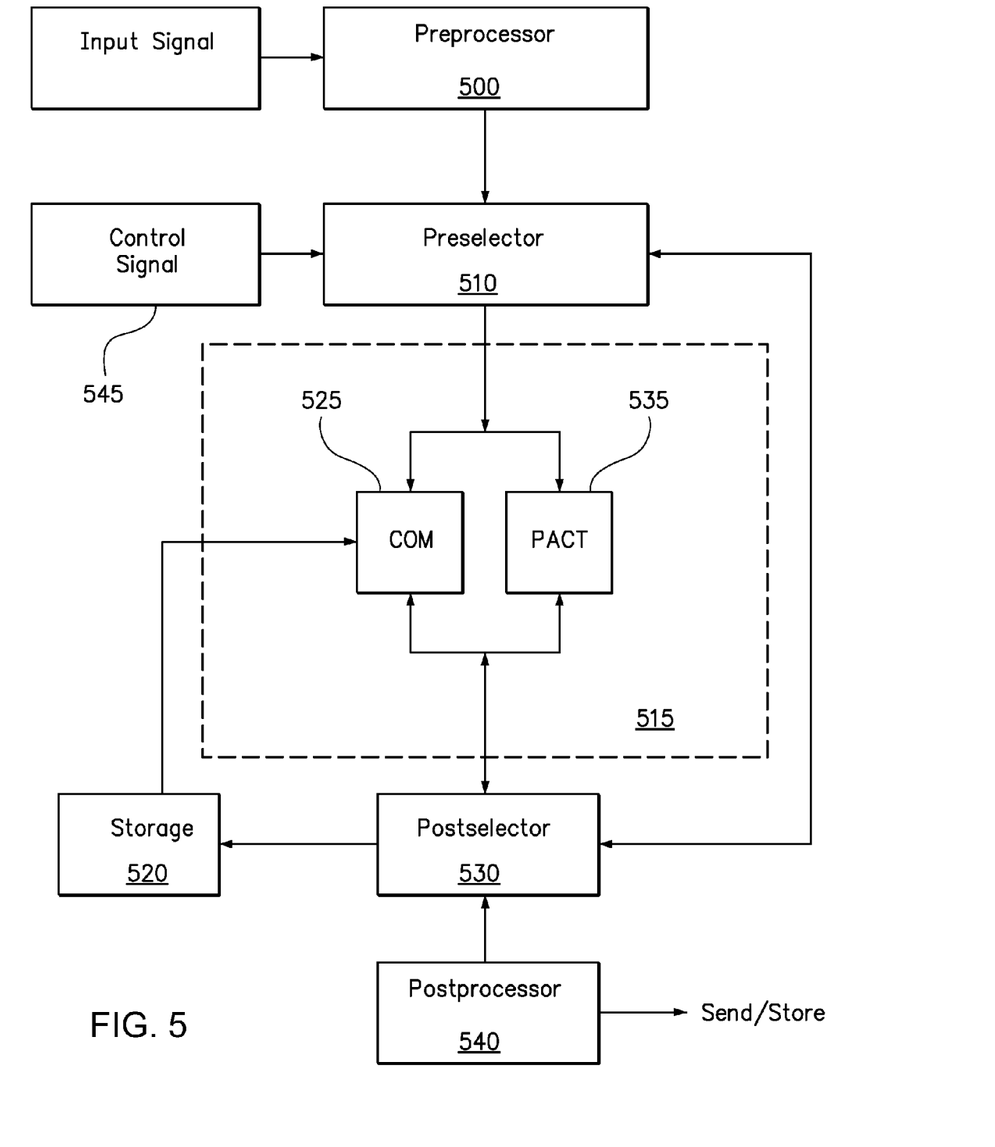

Referring now to FIG. 5, a mode of a specific embodiment of the invention can be illustrated. FIG. 5 shows a block diagram of the essential portion of a basic structure of a speech coder 50 that is capable of producing toll quality speech at bit rates comparable to those of modern codecs and which is implemented using the mixed COM/KAM strategy described in Mode 2 of this invention. The speech coder includes a preprocessor module 500; preselector unit 510, which controls the initialization process; and COM/PACT encoding module 515, which contains one COM unit 525 and one KAM 535 termed the Pulsed Autoregressive Compensator (PACT). Speech coder 50 can further include a storage unit 520 which contains restored earlier inputs $[Y_{k-m}, \ldots, Y_{k-1}]$ that can be accessed by the COM 525; and a postselector 530, which controls the model selection process in the regular (non-initialization) mode and which initiates the output process after the 'best' model if found by routing the relevant information described below to unit 520 and to the postprocessor 540. The postprocessor 540 operates the same as postprocessor 440 of FIG. 4, described in Mode 2, and therefore is omitted from the description here.

The preprocessor 500 in FIG. 5 processes input data using the same general methodology described for the preprocessing module 120 described above for Mode 1 (See FIG. 1), but adapted to the speech coding application. The input data is sampled, if analog, and windowed to create a frame using one of the windows from the existing art, with common choices including Hamming, Hann or Kaiser windows. The windowing operation may be applied to create frames of input data that overlap their preceding input frame by some fixed number of data points. Typically the frames are also filtered to remove noise using one of many known methods. Windows spanning from 5 milliseconds (ms) to 40 ms are common in speech coding. In some embodiments, Mode 3 uses 20 ms triangular windows and 50% frame overlap. Each created frame can be outputted by the preprocessor 530 to preselector 510.

Preselector 510 supplies the current input frame to either the COM 525 or the PACT 535, and this controls which model is initially use in COM/PACT module 515. Operations in preselector 510 follow the general description provided for the initialization process in preselector 410 in Mode 2, but with some differences. Specifically, preselector 510 switches to an 'initialization' mode at the start of the operation or after it detects a break in the input signal. In the given implementation, unit 510 remains in 'initialization' mode until enough frames have been accumulated in unit 520 to capture what is expected to be the maximum time span of one pitch period. For example, in coding speech spoken in standard American English, it is typically sufficient to capture 32 ms of continuous speech in the frames in unit 520. Other considerations described in Mode 1 can also influence the number of frames that are being accumulated in storage unit 520. After accumulation is completed, unit 510 can switch to 'regular' mode. While in 'initialization' mode, unit 510 activates the PACT unit 535 in module 515 by inputting to it the current input frame, to initiate modeling of this frame. While in the 'regular' mode, preselector 510 activates the COM unit 525 in COM/PACT module 515 by inputting to the COM 525 the received frames.

In some embodiments, COM/PACT module 515 in FIG. 5 can contain a COM 525 which estimates the linear 4-delay COM of the form shown in Eq. (2), and a PACT 535 which estimates an autoregressive linear predictor model described below. In this preferred embodiment, the $8^{th}$ order autoregressive linear predictor model is used. Alternative embodiments can use COM's 525 with a different number of delays and nonlinear function forms of COM and also different orders of the PACT 535 and different KAM in place of PACT. Estimation of the COM is performed in the COM 525 using the following embodiment of the general COM estimation procedure described in Mode 1 above. First, the set of candidate model outputs $\{Y_{\hat{k}}[COM_j], j=1, \ldots N\}$ is computed for all possible sets of parameter quantized as will be described below. As in the descriptions above, the superscript ˆ is used here to indicate a candidate value, the notation [ ] can be used to indicate the method being used to compute the given variable, and the subscript j is the index used to indicate the individual candidate parameter sets. The quality of each candidate model $Y_{\hat{k}}[COM_j]$ can then be evaluated using the perceptually weighted error (PWE) metric given by Eq. (7) above, and the parameter values which yields the minimum PWE are identified as those providing the optimal model and these parameters are supplied to postselector 530, along with the corresponding to them output $Y_k[COM]$.

Estimation of the PACT model can be performed in the PACT 535 as follows. In several embodiments an autoregressive linear predictor model of order 8 is estimated, given by:

$$X_k = \sum_{u=1}^{8} b_u X_u(z) + E_k, \quad (9)$$

where $X_k$ as before indicates an input sequence of some length L, $X_u(z)$ is a length L block of data with latency z, which means that the block starts z samples prior to the last point in $X_k$, $E_k$ is the modeling error known as the prediction error, and $b_u$, represents coefficients that are found by minimizing $E_k$ using, for example, the Levinson-Durbin algorithm or some other method according to the prior art. The input is regenerated from the estimated parameters according to Eq. (9), where $E_k$ is commonly approximated as shown in Eq.

(10). The approximation, denoted $R_k$, is computed as a combination of scaled, time-shifted pulses that are represented by Dirac delta functions as $$R_k = \sum_{v=1}^{P} c_v \delta_{p(v)}, \qquad (10)$$

where $\delta_{p(v)}$ denotes a Dirac delta function with amplitudes 1 at a point p (v) within the current frame and zero otherwise;
p (v) indicates the position of pulse v within the current frame;
$c_v$ indicates the gain for pulse v; and,
P is the number of pulses used in the approximation, with P=8 in the given embodiment.

The candidate parameter sets for the PACT model consist of the pulse positions $\{p_v\}$ and the coefficients $\{c_v\}$, which can be generated using a number of methods. One option is to adapt the same method that is employed to generate the COM parameters in this mode, with the different choices of methods described in Mode 1. In that case, pulse positions $\{p_v\}$ can be chosen the same way as the delays $\{d_i\}$, while coefficients $\{c_v\}$ can be computed the same way as the $\{a_i\}$ in Eq. (3). Other basic parameter selection methods can also be used without diminishing the claims made in this invention. The PACT model parameters can also be quantized using the methods described below and the quality of the corresponding candidate PACT models can be evaluated using the same metric as in the evaluation of candidate COM's described above. Specifically, $\{Y_{\hat{k}}[PACT_j], j=1, \ldots\}$ representing the synthesized results from the candidate PACT models are found and are used to compute the PWE. The parameter values which yields the minimum PWE are identified as the ones that provide the optimal model.

The parameters of the COM and the PACT models can be quantized in their respective units in COM/PACT module 515. The following embodiment assumes a narrow-band speech coder with input being sampled at an 8 kHz rate. In this case, the 20 ms input frames can contain 160 data points (L=160), which translates into 256 possible delay values for the COM and 160 pulse locations for the PACT model, both sets of values being positive integers. Both sets can be quantized directly using 8 bits. To reduce the number of bits used, this embodiment of Mode 3 can use the following known method of partitioning the delays and pulse locations into the interleaved subsets.

The delays can be partitioned into subsets containing 64 entries, and individual positions within each subset are represented using 6 bits. The PACT pulse locations are partitioned into subsets containing 32 entries, and individual positions within each grouping are represented using 5 bits. The COM coefficients $\{a_i\}$ are quantized to 12 bits using one of the known vector quantization methods. Thus, the total number of bits used in the COM code in this embodiment is (6*4)+12=36 bits per frame. The coefficients of the PACT linear predictor model can be converted to line spectral frequencies, as is standard to the art, and can be quantized using the known split vector quantization methods. The results are then divided into two sub-vectors of 4 frequencies each and 11 bits is used to encode each sub-vector, resulting in a total of 11+11=22 bits to represent the coefficients. The weights of the pulses in the PACT model are quantized to 13 bits using one of the known vector quantization methods, which can be the same method that is used to quantize the COM coefficients. The total number of bits used to represent the PACT in this example is 22+(5*8)+13=75 bits per frame.

The operating mode of the coder controls the sequence of functions performed in postselector 530. In the 'initialization' mode, postselector 530 receives the quantized parameter set for the optimal PACT model and initiates the process of outputting the code, which will be described below, while the system 50 advances to process the next frame. In the 'regular' mode, postselector 530 receives from module 515 the synthesized output $Y_{\hat{k}}$ [COM*] obtained from the best candidate COM model, along with the corresponding to it quantized parameter set, and computes the Signal-to-Noise Ratio (SNR) metric given in Eq. (5), using $Y_{\hat{k}}$ [COM*]. The superscript * denotes the optimal model for which the given variable is obtained. If SNR [COM*]<1 dB, it is taken as an indication that there is insufficient redundancy in the signal and the PACT model should be used to encode the frame. In this case, postselector 530 signals preselector 510 to input $X_k$ to the PACT unit in COM/PACT module 515 which initiates PACT estimation. Otherwise, postselector 530 supplies the residual error $E_k = X_k - Y_{\hat{k}}$ [COM*] to the PACT unit in COM/PACT module 515 which initiates PACT estimation.

After PACT 535 receives a frame containing either the input $X_k$ or the residual error entries $E_k$, the second model estimation is performed, where the PACT model is estimated the same way as was already described above, treating the received frame in each case as the input to be modeled. After the optimal PACT is found in the current iteration, the corresponding synthesized output $Y_{\hat{k}}$ [PACT*], if the input $X_k$ was modeled, or $Y_{\hat{k}}$ [COM*+PACT*], if the residual error $E_k$ was modeled, along with the corresponding quantized parameter sets are supplied by the PACT 535 to postselector 530 and are used to compute the Log-spectral distance (LSD) metric given by Eq. (6). In the case where the input $X_k$ was modeled in the second iteration, postselector 530 initiates the process of outputting the code, which will be described below, while the system advances to process the next frame. Otherwise, the Log-spectral distance (LSD) metric given by Eq. (6) is computed for both synthesized outputs $Y_{\hat{k}}$ [COM*] and $Y_{\hat{k}}$ [COM*+PACT*]. If the difference between the two metrics is less than a threshold value, specifically LSD[COM*]−LSD[COM**+PACT*]<0.5 dB in this embodiment, the COM 525 can be chosen as the final model, otherwise, PACT 535 can be chosen. In both cases, postselector 530 initiates the process of outputting the code, which will be described below, while the system 50 advances to process the next frame $X_{k+1}$.

The process of outputting the code in postselector 530 consists of supplying the chosen parameters and the model identifier code to the postprocessor 540. Further, as part of the output process, postselector 530 supplies to storage 520 the signal synthesized from the chosen parameters, which has typically been computed in the process of model identification, or, if not, postselector 530 can initiates that computation.

The described basic embodiment produces toll-quality speech in noise-free testing conditions at an average of 9.77 kilobits per second (kbps). The overall performance of this coder, in terms of both bit rate and perceptual quality, is in between the current state of the art G.729 and AMR coders operating in their highest quality modes. The basic embodiment used in the current Mode provides an example, chosen for the sake of simplicity and clarity of the presentation. Variations on the parameters specified above are also covered by the invention. Further, the COM based coder performance can be improved from the baseline described here by implementing various optimization options based on the principles described in Modes 1 and 2.

Speech Restoration at the Decoder

For Mode 3, the speech frames are reconstructed at the decoder using methods of Mode 2 described above.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A speech encoder, comprising:
    a processor for accomplishing a method for modeling an input signal, said input signal having a plurality of input signal frames $X_i$ and a current signal frame $X_k$, said method comprising the steps of;
    A) assembling data blocks $B_{d(i)}$ from signals representative of said $X_i$ while omitting the most recent data point of said current signal frame $X_k$ in the accomplishment of said step A);
    B) expressing said current signal frame $X_k$ as a linear combination of N said blocks $B_{d(i)}$ according to an expression $$X_k = \sum_{i=1}^{N} \alpha_i B_{d(i)},$$

where $a_i$ is a weighting coefficient for relative scaling of said blocks $B_{d(i)}$ and $d(i)$ is a time delay;
    D) generating at least one candidate synthetic speech sequence $\hat{X}_k$ using said expression from said step B), using at least one candidate time delays $d(i)\hat{}$ and at least one candidate coefficients $a_i\hat{}$;
    E) comparing said at least one synthetic candidate speech sequence $\hat{X}_k$ to predetermined acceptance criteria; and,
    F) accepting said synthetic candidate speech sequence $\hat{X}_k$ as representative of said current signal frame $X_k$ if said synthetic candidate speech sequence meets said acceptance criteria.

2. The speech encoder of claim 1, further comprising:
    a decoder, said decoder having a decoder processor for accomplishing a method for synthesizing an output frame $Y_k$ from said weighting coefficients $a_i$ and said time delays $d(i)$, said method comprising the steps of:
    G) determining if said weighting coefficients $a_i$ and said time delays $d(i)$ reference data contained within the output frame $Y_k$ being decoded;
    H) synthesizing the entire said output frame $Y_k$ all at once when said weighting coefficients $a_i$ and said time delays $d(i)$ do not reference data contained within the said output frame $Y_k$ being synthesized, using a synthesis equation $$Y_k = \sum_{i=1}^{N} \alpha_i B_{d(i)};$$

and,
    I) synthesizing individual points $y(s)$ of said output frame $Y_k$ sequentially when one or more of said weighting coefficients $a_i$ and said time delays $d(i)$ reference data contained within the output frame $Y_k$ being synthesized, said synthesis of individual points $y(s)$ being performed using an equation $$y(s) = \sum_{i=1}^{N} \alpha_i y(d(i) + s - 1).$$

* * * * *